United States Patent [19]

So

[11] Patent Number: 5,051,687
[45] Date of Patent: Sep. 24, 1991

[54] TRANSIMPEDANCE CIRCUIT

[75] Inventor: Eddy So, Gloucester, Canada

[73] Assignee: National Research Council of Canada/Conseil National de Recherches du Canada, Ottawa, Canada

[21] Appl. No.: 606,737

[22] Filed: Oct. 29, 1990

[51] Int. Cl.$^5$ .................. G01R 19/00; H01F 40/06
[52] U.S. Cl. .................. 323/357; 323/358; 324/127
[58] Field of Search ............ 323/355, 356, 357, 358; 324/127

[56] References Cited

U.S. PATENT DOCUMENTS

| | | | |
|---|---|---|---|
| 4,198,595 | 4/1980 | Milkovic | 323/357 |
| 4,250,448 | 2/1981 | Daniels | 323/358 |
| 4,967,145 | 10/1990 | Davies | 324/127 |

OTHER PUBLICATIONS

S. P. Mehta et al.; "Calibration of Test Systems for Measuring Power Losses of Transformers"-published in IEEE Transactions on Power Delivery, vol. PWRD-1, No. 4, Oct. 1986.

N. L. Kusters et al; "The Compensated Current Comparator; a New Reference Standard for Current-Transformer Calibrations in Industry"-published in IEEE Transactions on Instrumentation and Measurement, vol. IM-13, Nos. 2 and 3, Jun.-Sep. 1964, pp. 107-114.

Primary Examiner—Peter S. Wong

[57] ABSTRACT

A transimpedance circuit for generating an output voltage replica of an alternating current input has its accuracy improved by the use of a current comparator, the ratio windings of the comparator respectively carrying a current proportional to the input current and a current proportional to the output voltage. A further winding of the comparator detects any ampere-turns imbalance in the ratio windings, and, as a result, generates a correction signal proportional to such imbalance. This correction signal is then employed to correct the output voltage.

10 Claims, 1 Drawing Sheet

TRANSIMPEDANCE CIRCUIT

FIELD OF THE INVENTION

This invention relates to a transimpedance circuit, namely a circuit for generating an output voltage that is an accurate replica, in both amplitude and phase, of an input alternating current.

Such a circuit enables the input current to be readily measured by means of a voltmeter or other voltage measuring device. Such an arrangement is particularly useful for feeding a power transducer, such as a wattmeter, which is then required to multiply two voltages together, a function that can be performed with high accuracy.

BACKGROUND OF THE INVENTION

Transimpedance circuits are known. In its basic form, such a circuit is simply a current-to-voltage converter consisting of a current transformer with a resistive shunt connected across its secondary terminals, a voltage proportional to, and in phase with, the primary current appearing across such shunt. This voltage can then be amplified to provide a rated output voltage, say in the range of 1 V to 10 V. Alternatively, instead of a shunt, an operational amplifier with a resistive feedback, followed by a gain amplifier, can be used. Such transimpedance circuits have been used as current transducers in high-voltage loss measuring systems. See, for example, the circuits illustrated in "Calibration of Test Systems for Measuring Power Losses of Transformers" by S.P. Mehta et al., published in IEEE Transactions on Power Delivery, Vol. PWRD-1, No. 4, October 1986.

However, for such a circuit to provide accurate results, adjustments have to be provided to correct for the in-phase and quadrature errors at each gain setting of the amplifier.

The output of a transimpedance circuit is given by $$E_o = (I_p/n) \cdot R \cdot G \cdot [1 + (\alpha + j\beta)] \quad (1)$$

where $\alpha$ and $\beta$, respectively, are the in-phase and quadrature errors of the circuit, G is the gain of the output amplifier, R is the shunt resistance, $I_p$ is the primary current, and n is the nominal ratio of the current transformer. During calibration, $\alpha$ and $\beta$ can be adjusted to zero. However, due to temperature effects and changes (instability) in the accuracy adjustments, it is difficult to maintain a magnitude and phase accuracy of better than $\pm 100$ ppm and $\pm 100$ $\mu$rad, respectively, at all gain settings.

SUMMARY OF THE INVENTION

The object of the present invention is to provide a transimpedance circuit of increased accuracy, and more specifically to provide means for automatically correcting the magnitude and phase errors without requiring adjustment controls.

To this end, the invention provides a transimpedance circuit for generating an output voltage that is an accurate replica, in both amplitude and phase, of an input alternating current $I_p$, the circuit including a current comparator having first and second magnetic core means, a pair of ratio windings electromagnetically coupled with both the core means, and detection winding means electromagnetically coupled with the first core means but not with the second core means. Such a current comparator is known per se. See, for example, "The Compensated Current Comparator; A New Reference Standard for Current—Transformer Calibrations in Industry" by N. L. Kusters et al. IEEE Transactions on Instrumentation and Measurement, Volume IM-13, Numbers 2 and 3, June–September 1964 pages 107–114. A current $I_s'$ proportional to the input current $I_p$ is passed through a first of the ratio windings. Means are provided for generating a voltage replica $E_o$ of the current $I_s$, and a current replica $I_s'$ of this voltage replica is then passed through the second of the ratio windings. The detection winding means is connected to generate a correction signal proportional to any ampere-turns imbalance in the ratio windings. This correction signal is then employed to correct the output voltage.

In a feedback arrangement, the correction signal is in the form of a correction current that is applied to the means for generating the voltage replica in such a manner as to reduce this imbalance. As a result, the voltage replica becomes the desired accurate output voltage.

In a feedforward arrangement, the correction signal takes the form of a correction voltage, and a voltage proportional to such correction voltage is added to the voltage replica to produce the desired accurate output voltage.

DETAILED DESCRIPTION OF THE EMBODIMENT

Figures 1, 2:
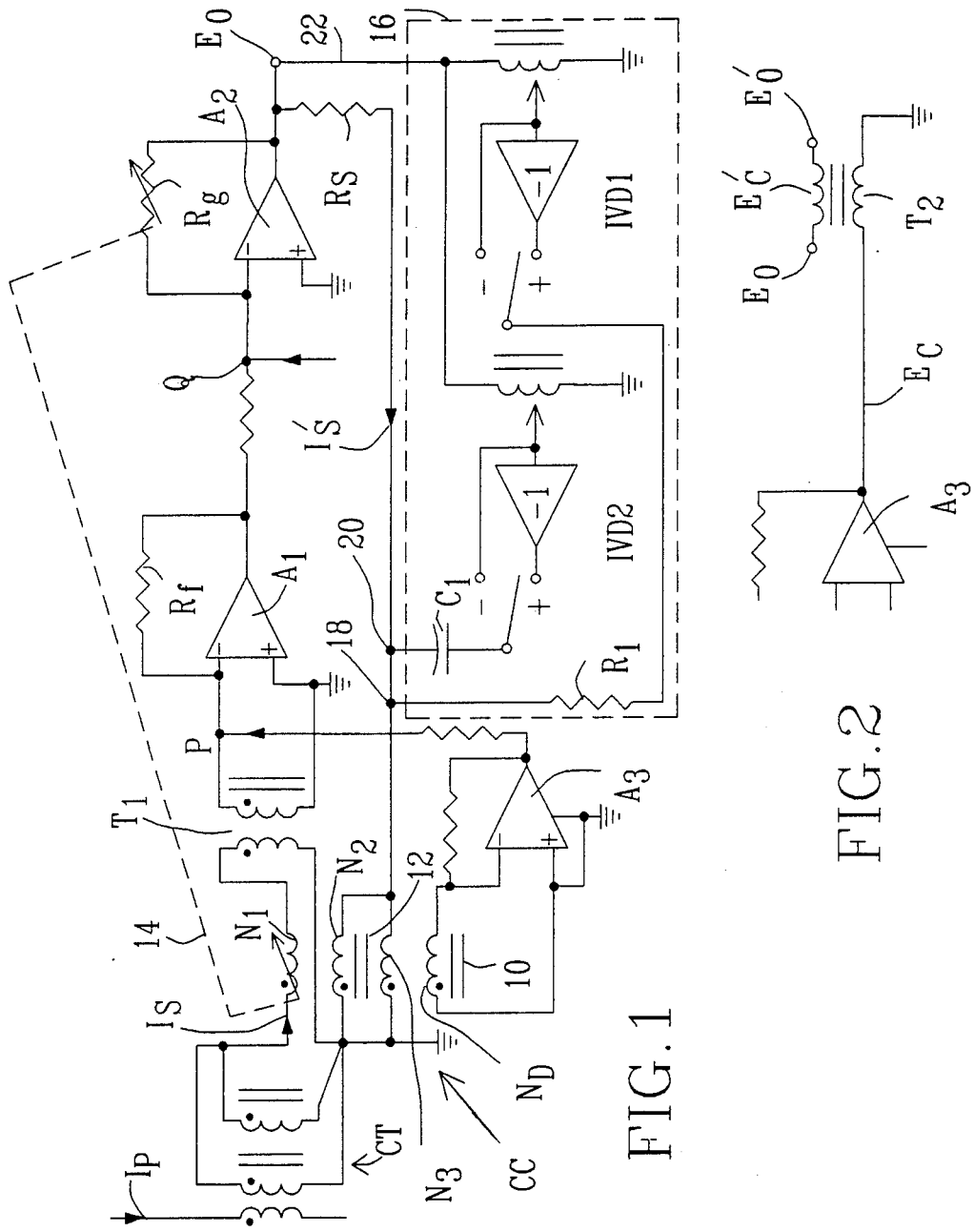
FIG. 1 shows a transimpedance circuit according to a preferred embodiment of the present invention.
FIG. 2 is a fragment of this circuit showing an alternative.

A two stage current transformer CT has the input current $I_p$ flowing through its primary winding. The secondary current $I_s$ generated by this transformer CT flows through one ratio winding $N_1$ of a current comparator CC and through the primary winding of a current transformer $T_1$, the secondary winding of which feeds into an operational amplifier $A_1$ having a feedback resistor $R_f$. The transformer $T_1$ is normally required to reduce the secondary current $I_s$ to a level that can be conveniently accommodated by the amplifier $A_1$, but can be omitted if the current $I_s$ is small enough. The input current transformer CT can also be omitted if the input current $I_p$ is small enough to be used directly as the current $I_s$. However, some form of isolating transformer between the primary current $I_p$ and the input to the amplifier $A_1$ is required. The amplifier $A_1$ is followed by an inverting amplifier $A_2$ that has a feedback resistor $R_g$ and generates the output voltage $E_o$. This arrangement is essentially the same as in the prior art, except for the presence of the current comparator CC.

The output voltage $E_o$ is applied to a stable and low-phase defect reference resistor $R_s$ to generate a current $I_s$, that is a replica of the voltage $E_o$ and which is returned to the secondary of the transformer CT through the second ratio winding $N_2$ of the current comparator CC, and, to a much less extent (typically two or three orders of magnitude less) through its compensating winding $N_3$, the function of which is to reduce the influence of the impedance of the winding $N_2$. The current comparator has two cores 10 and 12. The outer core 12 couples electromagnetically with the two ratio windings $N_1$ and $N_2$ that are outside it, but does not couple electromagnetically with the two windings that are inside it, namely the compensating winding $N_3$ and a detection winding $N_D$. The inner core 10 couples electromagnetically with all the windings.

Due to the magnitude and phase errors in the output voltage $E_o$, the current comparator CC will not be in ampere-turns balance, and hence there will be a difference current derived from the detection winding $N_D$. This current is amplified in an amplifier $A_3$ which constitutes the principal part of a feedback circuit for applying a correction current at P to the input of the amplifier $A_1$ so as to add this correction current to the current in the feedback resistor $R_f$. In this manner the magnitude and phase errors in the output voltage $E_o$ are corrected by this feedback circuit to produce an ampere-turns balance in the current comparator CC. The result is a highly accurate and stable output voltage $E_o$, e.g. better than 20 parts per million (ppm) in both magnitude and phase.

From the ampere-turns balance equation of the current comparator, the output voltage $E_o$ is given by $$E = (I_p/n) \cdot (N_1/N_2) \cdot R_s \quad (2)$$

where n is the winding ratio of the two-stage current transformer CT. Thus, the output voltage $E_o$ is determined only by the winding ratio n of the transformer CT, the reference resistor $R_s$, and the current comparator winding ratio $N_1/N_2$. The overall errors due to the magnitude and phase errors of the current transformer $T_1$, the feedback resistor $R_f$, and the amplifiers $A_1$ and $A_2$, are reduced by the gain of the feedback circuit, and these components effectively become "ideal" components with no errors. If $R_f$ is the effective resistance of the feedback resistor of amplifier $A_1$ corresponding to an ampere-turns balance in the current comparator CC, the output voltage $E_o$ can also be expressed as $$E = (I_p/n) \cdot (R_f/N) \cdot G \quad (3)$$

where G is the gain of the amplifier $A_2$ and N is the winding ratio of the current transformer $T_1$. From (2) and (3), $$R_s = (R_f/N) \cdot (N_2/N_1) \cdot G. \quad (4)$$

For $R_s$, $R_f$, and N constant, an increase in G requires a corresponding decrease in the current comparator winding ratio. Switches changing this winding ratio and the gain of amplifier $A_2$ are coupled at 14 to maintain $(N_2/N_1) \cdot G$ constant.

In a practical embodiment, the two-stage current transformer CT has a 1000-turn secondary and compensation windings for a rated secondary current of 1 A. The primary winding is a removable single-turn copper bar, insulated with filled epoxy for high-voltage operation up to 50 kilovolts, for feedthrough operation up to 1000 A.

The ratio windings $N_1$ and $N_2$ of the current comparator CC have 100 turns and 1000 turns, respectively. Winding $N_1$ is subdivided to yield overall ratio multipliers of 1000/1, 1000/2, 1000/5, 1000/10, 1000/20, 1000/50 and 1000/100, corresponding to gain settings of 1, 2, 5, 10, 20, 50 and 100 of amplifier $A_2$. The compensation winding $N_3$ also has 1000 turns and is connected in parallel with winding $N_2$ to reduce its leakage impedance. A 100-turn detection winding $N_D$ is connected to a current-to-voltage converter $A_3$ to obtain a voltage proportional to, and in-phase with, the unbalanced ampere-turns in the current comparator. The ratio errors of the current comparator are no greater than 10 ppm in both magnitude and phase.

Amplifiers $A_1$ and $A_2$ are commercial low-offset-voltage operational amplifiers designed for output voltage swings of up to $\pm 14.5$ V. Thus for a sinusoidal waveform, the output voltage of the transimpedance is limited to 10 V rms. The inverting amplifier $A_2$ has gain settings of 1, 2, 5, 10, 20, 50 and 100, corresponding to ranges of 100%, 50%, 20%, 10%, 5%, 2% and 1% of rated primary current. At each range, the rated output voltage is 10 V. As mentioned above, the gain switch is coupled at 14 to the ratio switch of the current comparator to keep $(N_2/N_1) \cdot G$ constant. The feedback from the amplifier $A_3$, depending on its polarity, can be introduced either at point P, as shown in the drawing, or at point Q. The gain of the feedback circuit is approximately 100, sufficient for the feedback circuit to be able to correct for the combined errors of transformer $T_1$, amplifiers $A_1$ and $A_2$, and the temperature effects.

Transformer $T_1$ has two ratios, 100 to one and 500 to one. It has two primary windings of 1 turn and 5 turns, and a secondary winding of 500 turns. For an input two-stage current transformer CT or other transformer with a comparable high accuracy, such as an electronically aided current transformer, with a 1 A rated secondary current, the ratio of the transformer $T_1$ is set at 100 to one to provide a rated current of 10 mA that can be accommodated by the amplifier $A_1$. The ratio of 500 to one is provided to allow an alternative use of an input current transformer with a 5 A rated secondary current. Since the errors of the transformer $T_1$ are reduced by the gain of the feedback circuit, its accuracy requirements are not critical.

For a 10 mA rated current to the amplifier $A_1$ and a 10 V rated output voltage, it can be calculated from equations (2) and (3) that the feedback resistor $R_f$ and the reference resistor $R_s$ must be 1 k$\Omega$ and 10 k$\Omega$, respectively. If an input current transformer with a 5 A rated secondary current is used, then the reference resistor $R_s$ must be 2 k$\Omega$. A switch can be provided to allow for use of either reference resistor with the corresponding ratio of the transformer $T_1$.

The magnitude and phase errors were found at all ranges to be better than $\pm 20$ ppm and $\pm 20$ $\mu$rad respectively. The nonlinearity errors were found to be not more than 3 ppm in both magnitude and phase. Thus this transimpedance circuit can be operated over at least four decades of primary current (from 0.1 percent to 100 percent of rated current) with an accuracy of better than 20 ppm in both magnitude and phase.

In the alternative arrangement shown in FIG. 2, the amplifier $A_3$, instead of providing a feedback circuit for applying a correction current at P or Q, provides a feedforward circuit for generating a correction voltage $E_c$. A voltage $E_c'$ proportional to the correction voltage $E_c$ is added to the output voltage $E_o$ by a transformer $T_2$, whereby to provide a final corrected output voltage $E_o'$. This arrangement thus modifies the voltage $E_o$ to incorporate the corrections found necessary by the ampere-turns imbalance in the current comparator CC. In this feedforward method of operation the current comparator is not brought to an ampere-turns balance, because the current $I_s'$ remains a current replica of the uncorrected output voltage $E_o$ rather than of the final, corrected, output voltage $E_o'$, because the reference resistor $R_s$ remains connected to $E_o$.

The subsidiary circuit 16 is optional and can be provided for the following reasons.

The transimpedance circuit, because of its high accuracy and wide dynamic range (from 0.1 percent to 100 percent of rated current), is very suitable for use as a current transducer in automatic high-voltage loss measuring systems for low-power-factor power measurements. It can also be used as a reference for calibrating non-conventional current transformers with a voltage output having the same nominal equivalent transimpedance. This latter technique requires the measurement of the difference between the two output voltages (i.e. the output voltage of the current transformer being calibrated and the output voltage of a standard) when the primary currents are identical. The difference voltage can be measured by providing means to modify the in-phase and quadrature components of the output voltage $E_o$ of the reference transimpedance circuit to make the difference voltage zero. This can be achieved using the additional circuit 16. The effective impedance of the reference resistor $R_s$ is modified by injecting at points 18 and 20 respectively in-phase and quadrature currents into the winding $N_2$, these currents being derived from the output voltage $E_o$ respectively through, for example, an inductive voltage divider IVDI with a resistor $R_1$ and an inductive voltage divider IVD2 with a capacitor $C_1$. The output voltage $E_o$ is in turn modified by the basic feedback or feedforward circuit to compensate for the effective change in the impedance of the reference resistor $R_s$. For an adjustment range of $+/-10$ percent in the in-phase and quadrature components of the output voltage $E_o$ and for a direct reading feature with 5-digit resolution, the voltage dividers IVDI and IVD2 are five-decade inductive voltage dividers with impedances of $R_1$ and $C_1$ (at 60 Hz) equal to $10R_s$. The direct reading feature can be achieved only to the extent that the errors of the reference transimpedance circuit can be neglected. The accuracy of the adjustments depends on the closed-loop gain of the feedback circuit. For a gain of 100, the accuracy of the adjustments is 1 percent of the settings of the inductive voltage dividers. Since these adjustments are used to measure only the error or deviation from a nominal value, the accuracy requirements are not stringent, and a 1 percent accuracy is satisfactory for most calibrations. Similar accuracy is obtainable in the feedforward mode.

I claim:

1. A transimpedance circuit for generating an output voltage that is an accurate replica, in both amplitude and phase, of an input alternating current $I_p$, said circuit comprising
    (a) a current comparator having first and second magnetic core means, a pair of ratio windings electromagnetically coupled with both said core means, and detection winding means electromagnetically coupled with the first core means but not with the second core means;
    (b) means for passing a current $I_s$ proportional to said input current $I_p$ through a first of said ratio windings;
    (c) means for generating a voltage replica $E_o$ of said current $I_s$;
    (d) means for passing a current replica $I_s'$ of said voltage replica through the second of said ratio windings;
    (e) means connected to said detection winding means for generating a correction signal proportional to an ampere-turns imbalance in the ratio windings; and
    (f) means receiving said correction signal for modifying said voltage replica to become the desired accurate output voltage.

2. A circuit according to claim 1, wherein said means (e) for generating a correction signal comprises means for generating a correction current proportional to said ampere-turns imbalance, and means for applying said correction current to said means (c) for generating the voltage replica to reduce said imbalance and thereby render said voltage replica the desired accurate output voltage.

3. A circuit according to claim 1, wherein said means (e) for generating a correction signal comprises means for generating a correction voltage proportional to said ampere-turns imbalance, and means for adding a voltage proportional to said correction voltage to said voltage replica to generate the desired accurate output voltage.

4. A circuit according to claim 1, wherein said means (d) for passing the current replica $I_s'$ through the second ratio winding comprises a reference resistor connected between the voltage replica and said second ratio winding.

5. A circuit according to claim 1, wherein said means (c) for generating the voltage replica comprises
    (i) a first amplifier receiving said current $I_s$ and having a first feedback resistor, and
    (ii) a second amplifier connected to receive an output from the first amplifier and having a second feedback resistor, said second amplifier generating said voltage replica.

6. A circuit according to claim 5, including means for varying the value of said second feedback resistor proportionately with the number of turns of one of said ratio windings.

7. A circuit according to claim 2, wherein said means (c) for generating the voltage replica comprises
    (i) a first amplifier receiving said current $I_s$ and having a first feedback resistor, and
    (ii) a second amplifier connected to receive an output from the first amplifier and having a second feedback resistor, said second amplifier generating said voltage replica; and
wherein said means for applying the correction current is connected to apply such correction current to an input of one of said amplifiers to modify the current in its feedback resistor.

8. A circuit according to claim 3, wherein said means for adding a voltage proportional to said correction voltage to the voltage replica comprises a transformer having a first winding connected to receive said correction voltage and a second winding connected to add said proportional voltage to the voltage replica to generate the desired accurate output voltage.

9. A circuit according to claim 4, including
    (g) means for deriving from the voltage replica in phase and quadrature currents proportional to such voltage replica, and
    (h) means for injecting said in-phase and quadrature currents into the current replica $I_s'$ that is passed through the second ratio winding.

10. A circuit according to claim 9, wherein said deriving means (g) comprise a first voltage divider in series with a resistor to derive said in-phase current and a second voltage divider in series with a capacitor to derive said quadrature current.

* * * * *